United States Patent
Shin et al.

(10) Patent No.: US 10,978,544 B2
(45) Date of Patent: Apr. 13, 2021

(54) DISPLAY PANEL HAVING A TOUCH SENSING FUNCTION AND A DISPLAY DEVICE HAVING THE SAME

(71) Applicant: Samsung Display Co., Ltd., Yongin-Si (KR)

(72) Inventors: JaeMin Shin, Suwon-si (KR); Sangwoo Kim, Seoul (KR); Jangyeol Yoon, Seoul (KR); Gyujeong Lee, Anyang-si (KR); Jongho Hong, Yongin-si (KR)

(73) Assignee: SAMSUNG DISPLAY CO., LTD., Yongin-si (KR)

(*) Notice: Subject to any disclaimer, the term of this patent is extended or adjusted under 35 U.S.C. 154(b) by 0 days.

(21) Appl. No.: 16/789,868

(22) Filed: Feb. 13, 2020

(65) Prior Publication Data

US 2020/0303487 A1 Sep. 24, 2020

(30) Foreign Application Priority Data

Mar. 19, 2019 (KR) .................. 10-2019-0031312

(51) Int. Cl.
- *G09G 3/3208* (2016.01)
- *H01L 27/32* (2006.01)
- *G06F 3/041* (2006.01)
- *G09G 3/3266* (2016.01)
- *G09G 3/3275* (2016.01)

(52) U.S. Cl.
CPC ........ *H01L 27/3276* (2013.01); *G06F 3/0412* (2013.01); *G09G 3/3266* (2013.01); *G09G 3/3275* (2013.01); *H01L 27/323* (2013.01); *G09G 2310/0264* (2013.01)

(58) Field of Classification Search
CPC ..... G06F 3/041; G09G 3/3208; G09G 3/3225
See application file for complete search history.

(56) References Cited

U.S. PATENT DOCUMENTS

| | | | |
|---|---|---|---|
| 2012/0081330 A1* | 4/2012 | Park | G09G 3/003 345/174 |
| 2016/0148572 A1 | 5/2016 | Yoo et al. | |
| 2016/0246433 A1 | 8/2016 | Lee et al. | |
| 2017/0038898 A1* | 2/2017 | Kim | G09G 3/3233 |
| 2017/0047019 A1* | 2/2017 | Li | G09G 3/3406 |
| 2018/0225500 A1 | 8/2018 | Han | |

FOREIGN PATENT DOCUMENTS

| | | |
|---|---|---|
| KR | 10-2016-0062282 | 6/2016 |
| KR | 10-2016-0103610 | 9/2016 |
| KR | 10-2018-0092003 | 8/2018 |

* cited by examiner

*Primary Examiner* — Roy P Rabindranath
(74) *Attorney, Agent, or Firm* — F. Chau & Associates, LLC

(57) ABSTRACT

A display panel including: data lines; scan lines; light emitting control lines; touch sensing lines; and pixels connected to the data lines, the scan lines, the light emitting control lines, and the touch sensing lines, a first pixel including: a light emitting diode including an anode and a cathode; a pixel driving circuit configured to apply a current corresponding to a data signal received through a first data line to the anode in response to a first scan signal received through a first scan line and a light emitting control signal received through a first light emitting control line; and a touch sensing output circuit configured to apply a voltage of the anode to a first touch sensing line in response to the first scan signal.

21 Claims, 8 Drawing Sheets

DISPLAY PANEL HAVING A TOUCH SENSING FUNCTION AND A DISPLAY DEVICE HAVING THE SAME

CROSS-REFERENCE TO RELATED APPLICATION

This U.S. non-provisional patent application claims priority under 35 U.S.C. § 119 to Korean Patent Application No. 10-2019-0031312, filed on Mar. 19, 2019, the disclosure of which is incorporated by reference herein in its entirety.

1. Technical Field

The present inventive concept relates to a display panel having a touch sensing function and a display device having the same.

2. Description of the Related Art

Various types of display devices, which are applied to multimedia devices, such as televisions, mobile phones, tablet computers, navigation devices, and game devices, are being developed. Among the display devices, an organic light emitting display device displays an image using an organic light emitting diode that generates light from electron-hole recombination. For example, the organic light emitting diode is a light emitting diode in which the emissive electroluminescent layer is a film of an organic compound that emits light in response to an electric current. The organic light emitting display device has characteristics, such as fast response speed and low power consumption.

The organic light emitting display device includes data lines, scan lines (or gate lines), and pixels connected to the data lines and the scan lines. Each pixel includes the organic light emitting diode and a circuit that controls an amount of current flowing through the organic light emitting diode. The circuit controls the amount of current flowing from a first driving voltage to a second driving voltage through the organic light emitting diode in response to a data signal. In this case, a light is generated corresponding to the amount of current flowing through the organic light emitting diode.

In addition, the organic light emitting display device may include a touch panel as an input device to sense a contact by a human finger or object.

SUMMARY

Exemplary embodiments of the inventive concept provide a display panel comprising: a plurality of data lines; a plurality of scan lines; a plurality of light emitting control lines; a plurality of touch sensing lines; and a plurality of pixels connected to the data lines, the scan lines, the light emitting control lines, and the touch sensing lines, a first pixel among the pixels comprising: a light emitting diode comprising an anode and a cathode; a pixel driving circuit configured to apply a current corresponding to a data signal received through a first data line among the data lines to the anode in response to a first scan signal received through a first scan line among the scan lines and a light emitting control signal received through a first light emitting control line among the light emitting control lines; and a touch sensing output circuit configured to apply a voltage of the anode to a first touch sensing line among the touch sensing lines in response to the first scan signal.

The voltage of the anode corresponds to a difference in voltage between the anode and the cathode of the light emitting diode.

The touch sensing output circuit comprises a transistor comprising a first electrode connected to the anode, a second electrode connected to the first touch sensing line, and a gate electrode connected to the first scan line.

The pixel driving circuit comprises: a first transistor comprising a first electrode, a second electrode, and a gate electrode, wherein the gate electrode is connected to a first node; a second transistor comprising a first electrode connected to the first data line, a second electrode connected to the first electrode of the first transistor, and a gate electrode connected to the first scan line; a third transistor comprising a first electrode connected to the second electrode of the first transistor, a second electrode connected to the gate electrode of the first transistor, and a gate electrode connected to the first scan line; a fourth transistor comprising a first electrode connected to the gate electrode of the first transistor, a second electrode for receiving an initialization voltage, and a gate electrode connected to a second scan line among the scan lines; a fifth transistor comprising a first electrode for receiving a first driving voltage, a second electrode connected to the first electrode of the first transistor, and a gate electrode connected to the first light emitting control line; and a sixth transistor comprising a first electrode connected to the second electrode of the first transistor, a second electrode connected to the anode of the light emitting diode, and a gate electrode connected to the first light emitting control line.

A second scan signal provided through the second scan line has a phase faster than a phase of the first scan signal.

The cathode of the light emitting diode receives a second driving voltage, and the second driving voltage has a voltage level lower than the first driving voltage.

The light emitting control signal has a non-active level when the first scan signal has an active level.

Exemplary embodiments of the inventive concept provide a display device comprising: a display panel comprising a plurality of data lines, a plurality of scan lines, a plurality of light emitting control lines, a plurality of touch sensing lines, and a plurality of pixels connected to the data lines, the scan lines, the light emitting control lines, and the touch sensing lines; an input sensing unit disposed on the display panel and comprising a plurality of sensing electrodes to sense an external touch input; a driving controller configured to receive an image signal and output an image data signal, a data control signal, and a scan control signal; a data driving circuit configured to drive the data lines in response to the image data signal and the data control signal; a scan driving circuit configured to drive the scan lines in response to the scan control signal; and a touch sensing circuit configured to output a touch detection signal in response to touch sensing signals applied to the touch sensing circuit from the touch sensing lines, a first pixel of the pixels comprising: a light emitting diode comprising an anode and a cathode; a pixel driving circuit configured to apply a current corresponding to a data signal received through a first data line among the data lines to the anode in response to a first scan signal received through a first scan line among the scan lines and a light emitting control signal received through a first light emitting control line among the light emitting control lines; and a touch sensing output circuit configured to apply a voltage of the anode to a first touch sensing line among the touch sensing lines in response to the first scan signal.

The driving controller applies a mode signal to the touch sensing circuit, and the touch sensing circuit applies the touch detection signal to the driving controller when the mode signal is at an active level.

The touch sensing circuit comprises: a memory for storing a reference value; an analog-to-digital converter configured to convert each of the touch sensing signals applied to the analog-to-digital converter from the touch sensing lines to a digital sensing signal; and a comparator configured to compare the reference value with the digital sensing signal and output the touch detection signal corresponding to a result of the comparison.

The touch detection signal is output at the active level when the digital sensing signal is greater than the reference value.

The comparator compares the reference value with the digital sensing signal and outputs the touch detection signal corresponding to the result of the comparison when the mode signal is at the active level.

The driving controller controls the data driving circuit and the scan driving circuit such that a group of pixels among the pixels displays an image having a predetermined gray scale when an amount of an external light is smaller than a reference level.

The voltage of the anode corresponds to a difference in voltage between the anode and the cathode of the light emitting diode depending on an amount of a light incident from an outside.

The touch sensing output circuit comprises a transistor comprising a first electrode connected to the anode, a second electrode connected to the first touch sensing line, and a gate electrode connected to the first scan line.

The pixel driving circuit comprises: a first transistor comprising a first electrode, a second electrode, and a gate electrode, wherein the gate electrode is connected to a first node; a second transistor comprising a first electrode connected to the first data line, a second electrode connected to the first electrode of the first transistor, and a gate electrode connected to the first scan line; a third transistor comprising a first electrode connected to the second electrode of the first transistor, a second electrode connected to the gate electrode of the first transistor, and a gate electrode connected to the first scan line; a fourth transistor comprising a first electrode connected to the gate electrode of the first transistor, a second electrode for receiving an initialization voltage, and a gate electrode connected to a second scan line among the scan lines; a fifth transistor comprising a first electrode for receiving a first driving voltage, a second electrode connected to the first electrode of the first transistor, and a gate electrode connected to the first light emitting control line; and a sixth transistor comprising a first electrode connected to the second electrode of the first transistor, a second electrode connected to the anode of the light emitting diode, and a gate electrode connected to the first light emitting control line.

A second scan signal provided through the second scan line has a phase faster than a phase of the first scan signal.

The cathode of the light emitting diode receives a second driving voltage, and the second driving voltage has a voltage level lower than the first driving voltage.

The light emitting control signal is at a non-active level when the first scan signal is at an active level.

The driving controller outputs the mode signal at the active level when the input sensing unit is in an inoperable mode. Exemplary embodiments of the inventive concept provide a display panel comprising: a plurality of pixels, wherein a first pixel of the plurality of pixels includes a pixel driving circuit and a touch sensing output circuit, the pixel driving circuit including: a first transistor including a first electrode, a second electrode, and a gate electrode; a second transistor including a first electrode connected to a data line, a second electrode connected to the first electrode of the first transistor, and a gate electrode connected to a first scan line; a third transistor including a first electrode connected to the gate electrode of the first transistor, a second electrode connected to the second electrode of the first transistor, and a gate electrode connected to the first scan line; a fourth transistor including a first electrode connected to the gate electrode of the first transistor, a second electrode for receiving an initialization voltage, and a gate electrode connected to a second scan line; a fifth transistor including a first electrode for receiving a driving voltage, a second electrode connected to the first electrode of the first transistor, and a gate electrode connected to a light emitting control line; and a sixth transistor including a first electrode connected to the second electrode of the first transistor, a second electrode connected to an anode of a light emitting diode, and a gate electrode connected to the light emitting control line, the touch sensing output circuit including: a seventh transistor including a first electrode connected to the anode, a second electrode connected to a touch sensing, line, and a gate electrode connected to the first scan line.

A voltage of the anode is applied to the touch sensing line in response to a first scan signal applied to the first scan line.

The touch sensing output circuit senses a variation in a level of the voltage of the anode to determine whether a touch input occurs at the display panel.

BRIEF DESCRIPTION OF THE DRAWINGS

The above and other features of the present inventive concept will become more apparent by describing in detail exemplary embodiments thereof with reference to the accompanying drawings wherein.

DETAILED DESCRIPTION OF THE EMBODIMENTS

Figure 1:
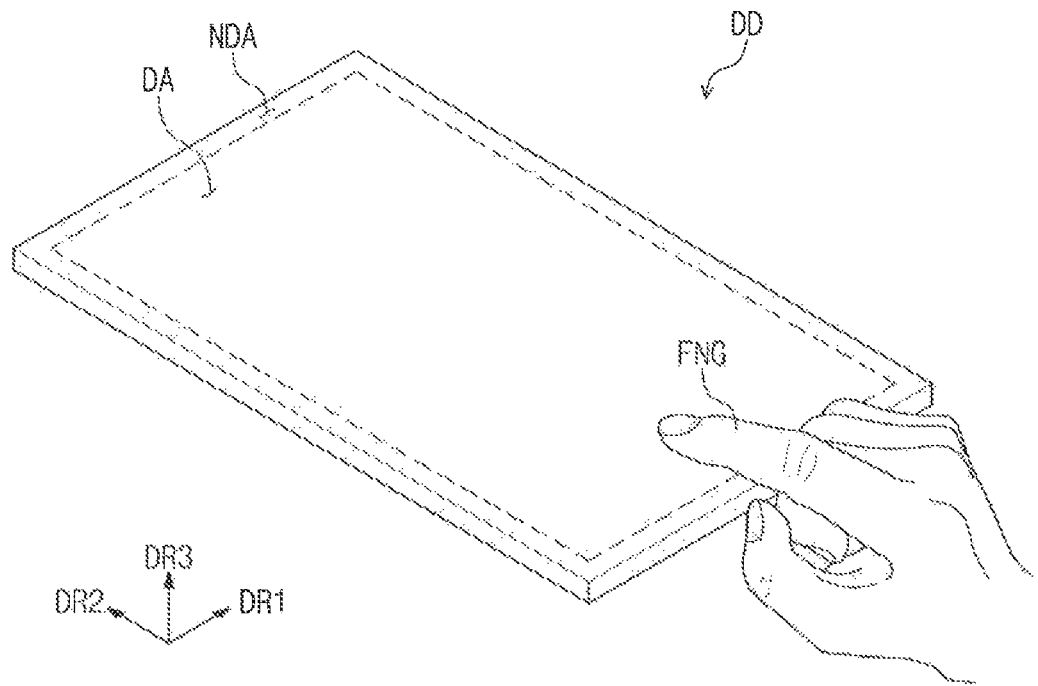
FIG. 1 is a perspective view showing a display device according to an exemplary embodiment of the present inventive concept.

In the specification, it will be understood that when an element or layer is referred to as being "on", "connected to" or "coupled to" another element or layer, it can be directly on, connected or coupled to the other element or layer or intervening elements or layers may be present.

Like numerals may refer to like elements throughout the drawings. In the drawings, the thickness of layers, films, and regions may be exaggerated for clarity.

As used herein, the singular forms, "a", "an" and "the" are intended to include the plural forms as well, unless the context clearly indicates otherwise.

Hereinafter, the present inventive concept will be explained in detail with reference to the accompanying drawings.

FIG. 1 is a perspective view showing a display device DD according to an exemplary embodiment of the present inventive concept.

Referring to FIG. 1, the display device DD may be a device driven in response to electrical signals. As shown in FIG. 1, the display device DD may be divided into a display area DA and a non-display area NDA when viewed in a plan view.

The display area DA may be an area that is activated in response to electrical signals. In the present exemplary embodiment, the display area DA may be an area that senses an external input FNG in response to the electrical signals applied thereto.

The external input FNG may be provided in various ways. For example, the external input FNG may include touch, light, and pressure. The touch may include a proximity touch and a direct touch. The external input FNG may be provided in various ways depending on the use of the display device DD.

In the present exemplary embodiment, the display device DD may be a touch sensing device. Accordingly, the external input FNG may be the direct touch by a user, however, this is merely exemplary. For example, the display device DD may include various touch sensing circuits as long as the display device DD can sense the external input FNG. Accordingly, the display device DD should not be limited to a specific embodiment.

The non-display area NDA is adjacent to the display area DA. Signal lines, which are used to transmit electrical signals to the display area DA, or driving devices are disposed in the non-display area NDA.

In the present exemplary embodiment, the non-display area NDA has a frame shape to surround the display area DA, however, this is merely exemplary. The non-display area NDA may have various shapes or may be omitted.

Figure 2:
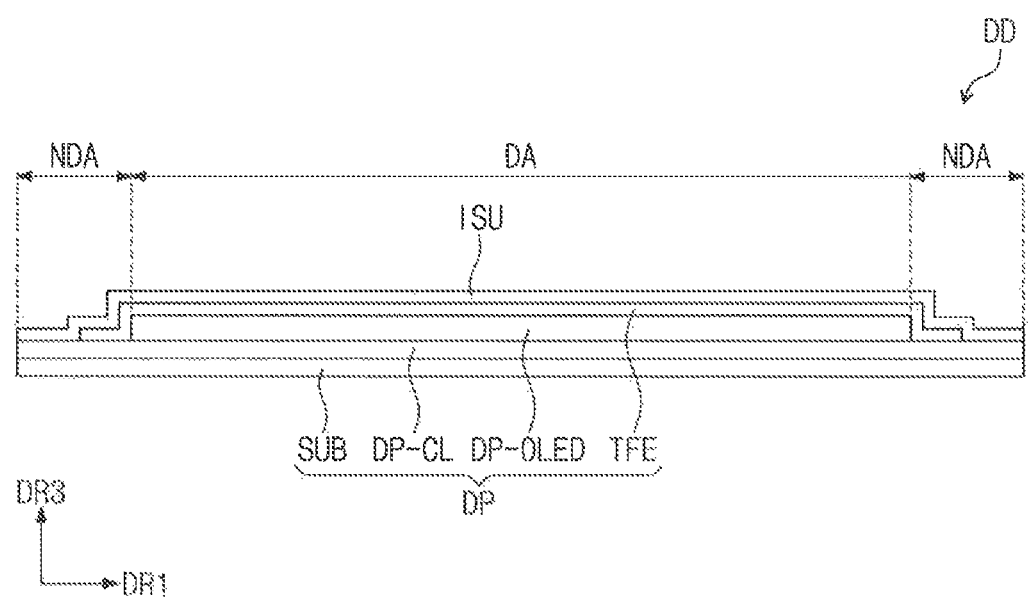
FIG. 2 is a cross-sectional view showing a display device according to an exemplary embodiment of the present inventive concept.

FIG. 2 is a cross-sectional view showing, the display device DD according to an exemplary embodiment of the present inventive concept.

Referring to FIG. 2, the display device DD includes a display panel DP and an input sensing unit ISU. The display device DD may further include a protective member disposed on a lower surface of the display panel DP and an anti-reflection member and/or a window member disposed on an upper surface of the input sensing unit ISU.

The display panel DP may be a light emitting type display panel, however, it should not be particularly limited. For instance, the display panel DP may be an organic light emitting display panel or a quantum dot light emitting display panel. The organic light emitting display panel may include a light emitting layer containing an organic light emitting material. The quantum dot light emitting display panel may include a light emitting layer containing a quantum dot and a quantum rod. Hereinafter, the organic light emitting display panel will be described as a representative example of the display panel DP.

The display panel DP includes a base layer SUB a circuit element layer DP-CL disposed on the base layer SUB, a display element layer DP-OLED, and a thin film encapsulation layer TFE. The display panel DP may further include functional layers, such as an anti-reflection layer and a refractive index control layer.

The base layer SUB may include at least one plastic film. The base layer SUB may include a plastic substrate, a glass substrate, a metal substrate, or an organic inorganic composite substrate as a flexible substrate. The display area DA and the non-display area NDA, which are described with reference to FIG. 1, may be arranged on the base layer SUB.

The circuit element layer DP-CL includes at least one intermediate insulating layer and a circuit element. The intermediate insulating layer includes at least one intermediate inorganic layer and at least one intermediate organic layer. The circuit element includes signal lines and a driving circuit for a pixel. This will be described in detail later.

The display element layer DP-OLED includes at least organic light emitting diodes. The display element layer DP-OLED further includes an organic layer such as a pixel definition layer. The display element layer DP-OLED may overlap the circuit element layer DP-CL.

The thin film encapsulation layer TFE encapsulates the display element layer DP-OLED. The thin film encapsulation layer TFE includes at least one inorganic layer (hereinafter, referred to as an "encapsulation inorganic layer"). The thin film encapsulation layer TFE further includes at least one organic layer (hereinafter, referred to as an "encapsulation organic layer"). The encapsulation inorganic layer protects the display element layer DP-OLED from moisture and oxygen, and the encapsulation organic layer protects the display element layer DP-OLED from foreign substance such as dust particles. The encapsulation inorganic layer includes a silicon nitride layer, a silicon oxynitride layer, a silicon oxide layer, a titanium oxide layer, or an aluminum oxide layer. The encapsulation organic layer includes an acrylic-based organic layer, however, it should not be limited thereto.

The input sensing unit ISU obtains coordinate information on the external input FNG. The input sensing unit ISU is formed on the display panel DP through successive processes or at least some components are coupled to each other by an adhesive member.

The input sensing unit ISU may have a multi-layer structure. The input sensing unit ISU may include a single-layer or multi-layer structure of conductive layers. The input sensing unit ISU may include a single-layer or multi-layer structure of insulating layers.

The input sensing unit ISU may sense the external input FNG by a capacitive sensing method, however, the operation of the input sensing unit ISU should not be particularly limited. For example, the input sensing unit ISU may sense the external input FNG by an electromagnetic induction method or a pressure sensing method.

Figure 3:
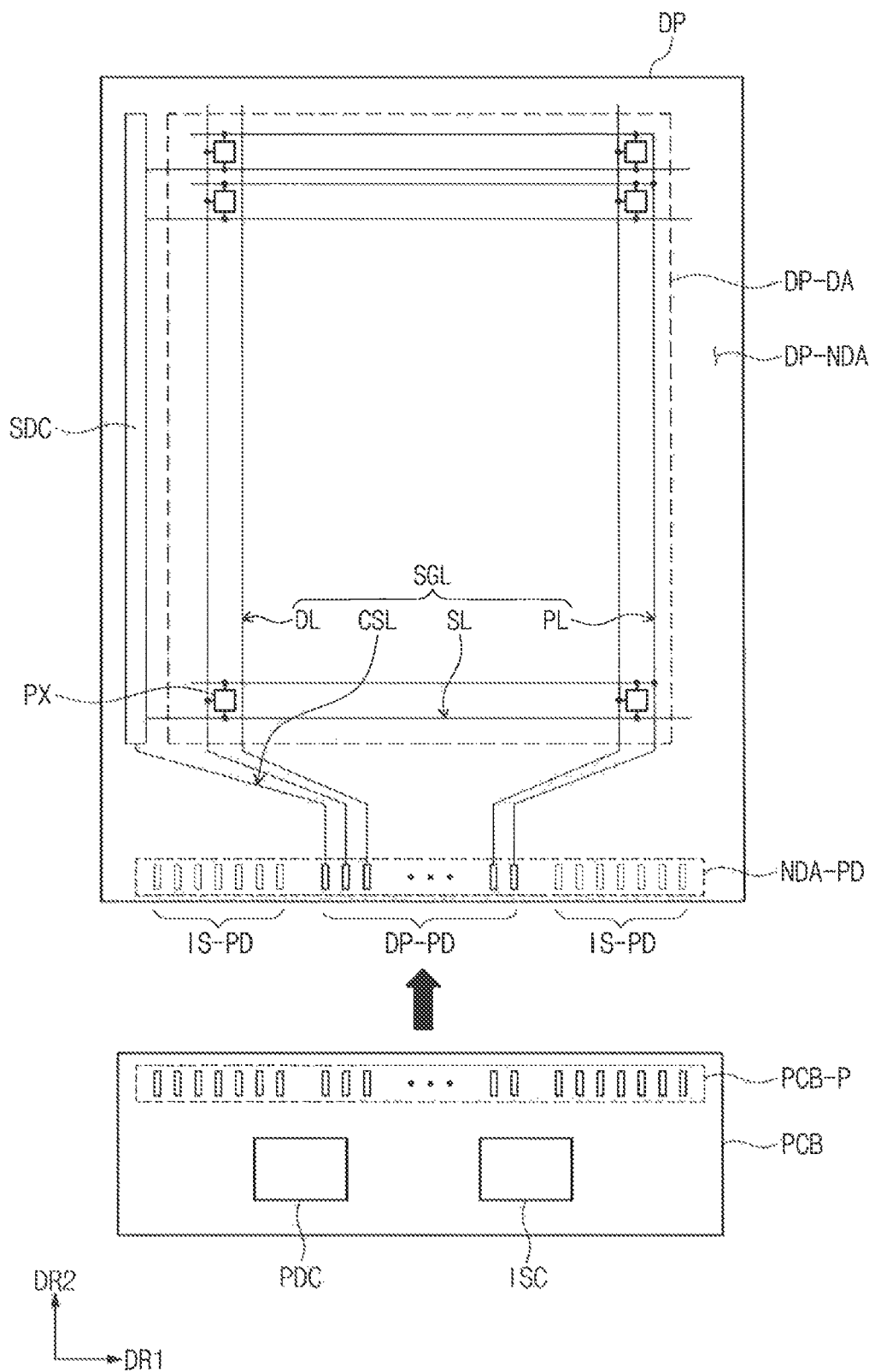
FIG. 3 is a plan view showing a display panel according to an exemplary embodiment of the present inventive concept.

FIG. 3 is a plan view showing the display panel DP according to an exemplary embodiment of the present inventive concept.

As shown in FIG. 3, the display panel DP includes a display area DP-DA and a non-display area DP-NDA when viewed in a plan view. In the present exemplary embodiment, the non-display area DP-NDA is provided along an edge of the display area DP-DA. The display area DP-DA and the non-display area DP-NDA of the display panel DP respectively correspond to the display area DA and the non-display area NDA of the display device DD shown in FIGS. 1 and 2.

The display panel DP includes a driving circuit SDC, a plurality of signal lines SGL (hereinafter, referred to as "signal lines"), a plurality of signal pads DP-PD (hereinafter, referred to as "signal pads"), and a plurality of pixels PX (hereinafter, referred to as "pixels"). The pixels PX are arranged in the display area DP-DA. Each of the pixels PX includes an organic light emitting diode and a pixel driving circuit connected to the organic light emitting diode. The driving circuit SDC, the signal lines SGL, the signal pads DP-PD, and the pixel driving circuit may be included in the circuit element layer DP-CL shown in FIG. 2.

The driving circuit SDC includes a scan driving circuit. The scan driving circuit generates a plurality of scan signals (hereinafter, referred to as "scan signals") and sequentially outputs the scan signals to a plurality of scan lines SL (hereinafter, referred to as "scan lines"). The scan driving circuit may further output another control signal to the driving circuit of the pixels PX.

The driving circuit SDC includes a plurality of thin film transistors formed through the same process, e.g., a low temperature polycrystalline silicon (LIPS) process or a low temperature polycrystalline oxide (LTPO) process. The plurality of thin film transistors may form the driving circuit of the pixels PX.

The signal lines SQL include the scan lines SL, data lines DL, a power line PL, and a control signal line CSL. Each scan line SL is connected to a corresponding pixel among the pixels PX, and each data line DL is connected to a corresponding pixel among the pixels PX. The power line PL is connected to the pixels PX. The control signal line CSL applies control signals to the driving circuit. SDC.

The signal lines SGL overlap the display area DP-DA and the non-display area DP-NDA. The signal lines SQL include a pad part and a line part. The line part overlaps the display area DP-DA and the non-display area DP-NDA. The pad part is connected to an end of the line part. The pad part is disposed in the non-display area DP-NDA and overlaps a corresponding signal pad among the signal pads DP-PD. An area in the non-display area DP-NDA, in which the signal pads DP-PD are disposed, is a pad area NDA-PD.

The line part connected to the pixels PX may form most of the signal lines SGL. The line part may be connected to transistors of the pixel PX. The line part may have a single-layer or multi-layer structure and may include a single body or two or more portions. The two or more portions may be disposed on different layers from each other and may be connected to each other via a contact hole in an insulating layer disposed between the two or more portions.

The display panel DP may further include input sensing pads IS-PD disposed in the pad area NDA-PD. The input sensing pads IS-PD may be formed through the same process as the signal lines SGL, and thus, the input sensing pads IS-PD may be disposed on the same layer as the signal lines SGL.

The input sensing pads IS-PD may overlap the pad part of the signal lines included in the input sensing unit ISU shown in FIG. 2. The input sensing pads IS-PD may be electrically insulated from the signal lines SGL of the display panel DP.

FIG. 3 further shows a circuit board PCB electrically connected to the display panel DP. The circuit board PCB may be a rigid circuit board or a flexible circuit board. The circuit board PCB may be directly coupled to the display panel DP or may be connected to the display panel DP through another circuit board.

A panel driving circuit PDC may be mounted on the circuit board. PCB to control an operation of the display panel DP. In addition, an input sensing circuit ISC may be mounted on the circuit board PCB to control the input sensing unit ISU. Each of the panel driving circuit PDC and the input sensing circuit ISC may be mounted on the circuit board PCB in the form of an integrated chip. In an exemplary embodiment of the present inventive concept, each of the panel driving circuit PDC and the input sensing circuit ISC may be mounted on the circuit board PCB in the form of one integrated chip. The circuit board PCB may include circuit board pads PCB-P electrically connected to the display panel DP. The circuit board PCB may further include signal lines that connect the circuit board pads PCB-P to the panel driving circuit PDC and/or the input sensing circuit ISC.

Figure 4:
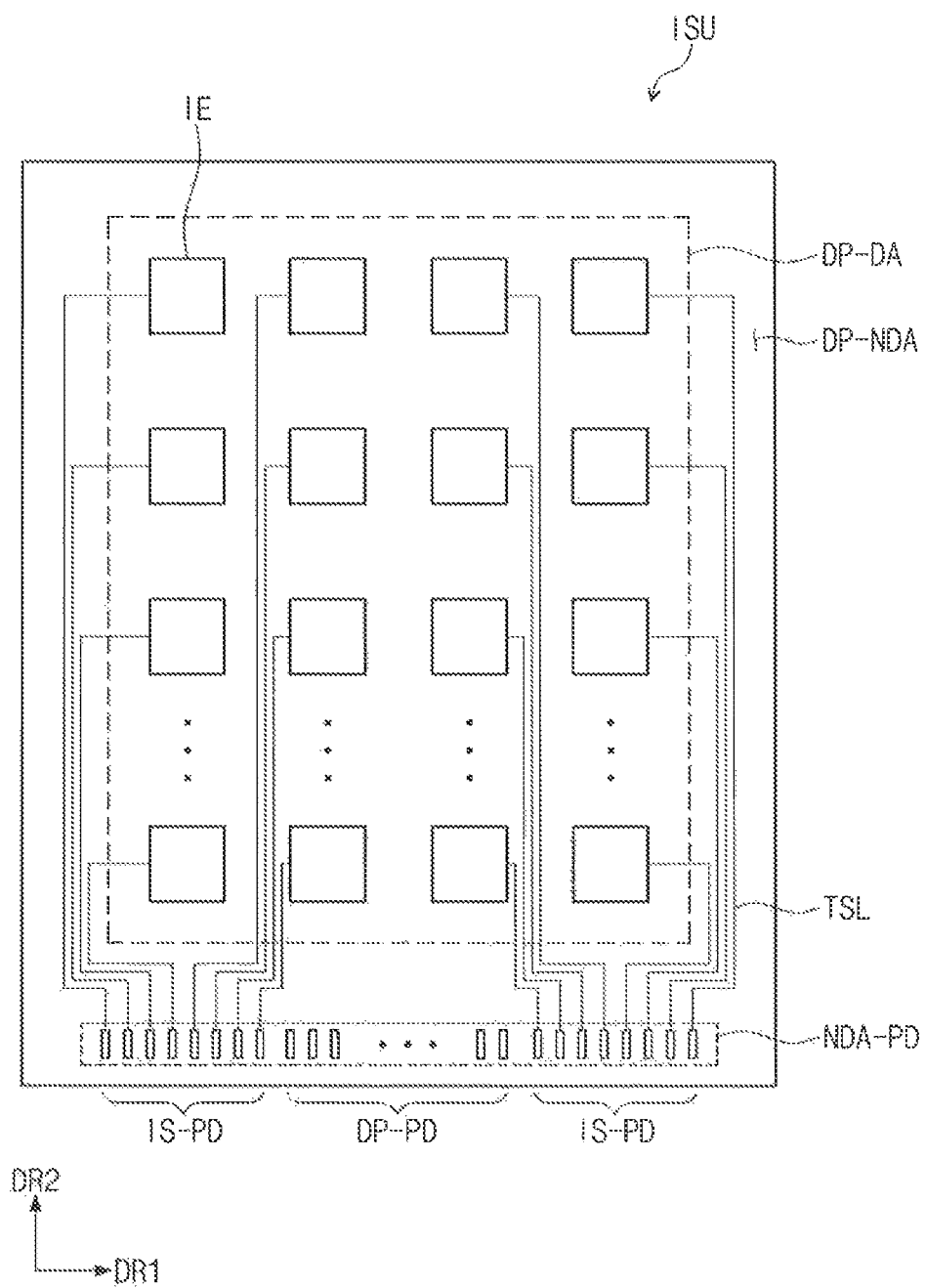
FIG. 4 is a plan view showing an input sensing unit according to an exemplary embodiment of the present inventive concept.

FIG. 4 is a plan view showing the input sensing unit ISU according to an exemplary embodiment of the present inventive concept.

Referring to FIG. 4, the input sensing unit ISU includes a plurality of sensing electrodes IE (hereinafter, referred to as "sensing electrodes") and a plurality of touch signal lines TSL (hereinafter, referred to as "touch signal lines). The sensing electrodes IE have inherent coordinate information. For instance, the sensing electrodes IF are arranged in a matrix form and respectively connected to the touch signal lines TSL. The shape and arrangement of the sensing electrodes IE should not be particularly limited. The sensing electrodes IE are arranged in the display area DP-DA. Some portions of the signal lines SL are disposed in the display area DP-DA, and the other portions of the signal lines SL are disposed in the non-display area DP-NDA. The input sensing unit ISU according to the present exemplary embodiment obtains the coordinate information by a self-capacitance method. It is to be understood, however, that the driving method of the input sensing unit ISU should not be particularly limited, and the input sensing unit ISU may sense the external input by a mutual capacitance method and/or the self-capacitance method.

In the present exemplary embodiment, the sensing electrodes IF have a quadrangular shape as a representative example, however, the shape of the sensing electrodes IE should not be limited to the quadrangular shape. The sensing electrodes IE may have a polygonal shape.

The sensing electrodes IE may include a conductive material. The conductive material may include metal materials or alloys thereof. As the metal materials, gold (Au), silver (Ag), aluminum (Al), molybdenum (Mo), chromium (Cr), titanium (Ti), nickel (Ni), neodymium (Nd), copper (Cu), and platinum (Pt) may be used.

In addition, the sensing electrodes IE may include a transparent conductive material. Various materials, such as silver nanowire (AgNW), indium tin oxide (ITO), indium zinc oxide (IZO), antimony zinc oxide (AZO), indium tin zinc oxide (ITZO), zinc oxide (ZnO), tin oxide (SnO2), carbon nanotube, and graphene, may be used as the transparent conductive material. The sensing electrodes IE may have a single-layer or multi-layer structure.

Figure 5:
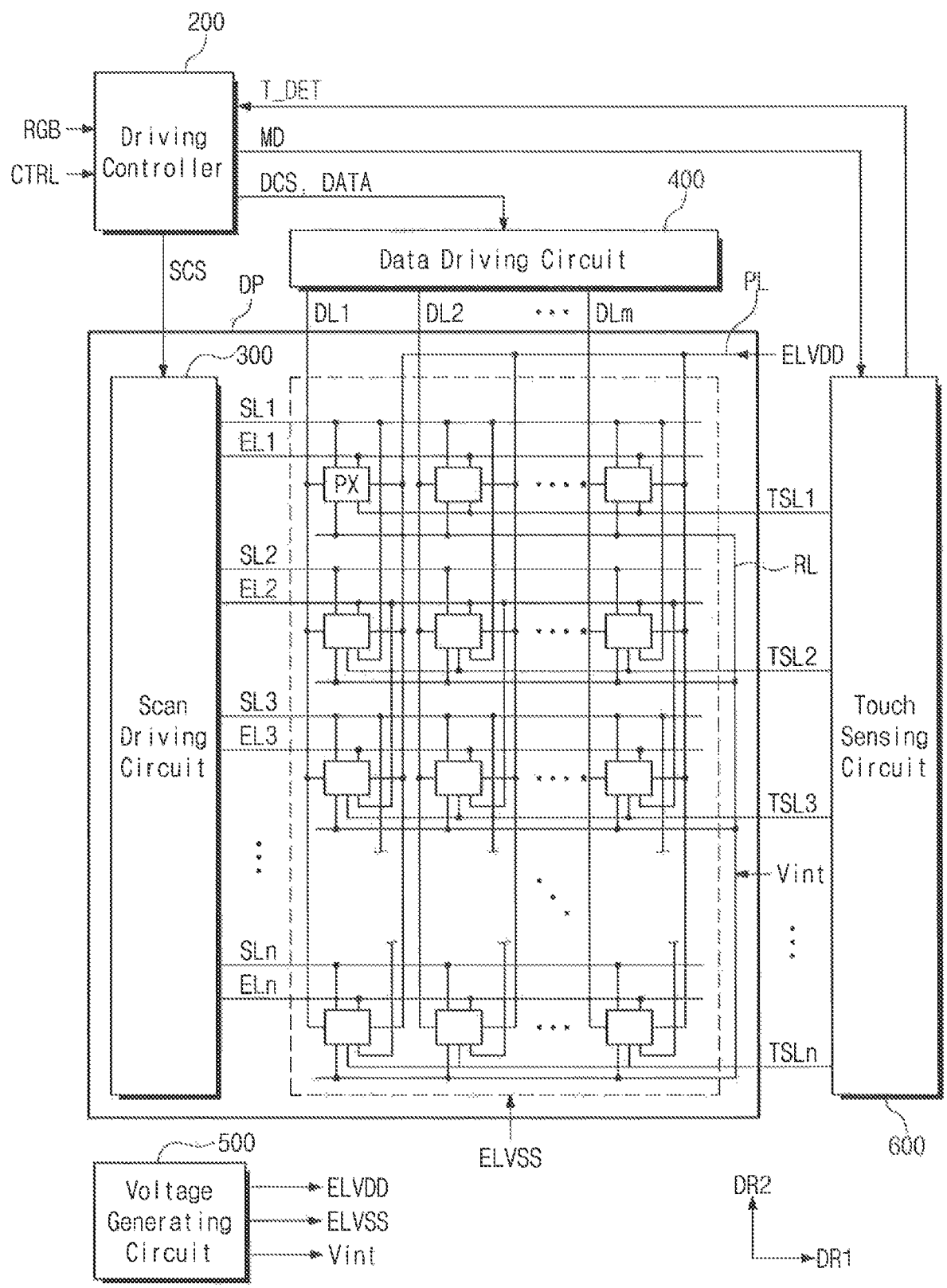
FIG. 5 is a block diagram showing an organic light emitting display device according to an exemplary, embodiment of the present inventive concept.

FIG. 5 is a block diagram showing an organic light emitting display device according to an exemplary embodiment of the present inventive concept.

Referring to FIG. 5, the organic light emitting display device includes a display panel DP, a driving controller 200, a scan driving circuit 300, a data driving circuit 400, a voltage generating circuit 500, and a touch sensing circuit 600. The scan driving circuit 300 may be included in the driving circuit SDC shown in FIG. 3. In addition, the driving controller 200, the data driving circuit 400, the voltage generating circuit 500, and the touch sensing circuit 600 may be included in the panel driving circuit PDC shown in FIG. 3.

According to another exemplary embodiment of the present inventive concept, the touch sensing circuit 600 may be disposed in the non-display area DP-NDA of the display panel DP. According to another exemplary embodiment of the present inventive concept, the touch sensing circuit 600 may be disposed in the driving controller 200.

The driving controller 200 receives image signals RGB and control signals CTRL and converts a data format of the image signals RGB to a data format appropriate to an interface between the data driving circuit 400 and the driving controller 200 to generate image data signals DATA. The driving controller 200 outputs a scan control signal SCS.

The voltage generating circuit 500 generates voltages required to operate the organic light emitting display device. In the present exemplary embodiment, the voltage generating circuit 500 generates a first driving voltage ELVDD, a second driving voltage ELVSS, and an initialization voltage Vint.

The scan driving circuit 300 receives the scan control signal SCS from the driving controller 200. The scan control signal SCS includes a start pulse signal to start an operation of the scan driving circuit 300. The scan driving circuit 300 generates the scan signals and sequentially outputs the scan signals to scan lines SL1 to SLn. In addition, the scan driving circuit 300 generates a plurality of light emitting control signals in response to the scan control signal SCS and outputs the light emitting control signals to a plurality of light emitting control lines EL1 to ELn.

In FIG. 5, the scan signals and the light emitting control signals are output from one scan driving circuit 300, however, the present inventive concept should not be limited thereto. According to another exemplary embodiment of the present inventive concept, a plurality of scan driving circuits may divide and output the scan signals and the light emitting control signals. In addition, according to another exemplary embodiment of the present inventive concept, a driving circuit that generates and outputs the scan signals may be separately provided from a driving circuit that generates and outputs the light emitting control signals.

The data driving circuit 400 receives a data control signal DCS and the image data signals DATA from the driving controller 200. The data driving circuit 400 converts the image data signals DATA to data signals and outputs the data signals to a plurality of data lines DL1 to DLm described later. The data signals are analog voltages corresponding to grayscale values of the image data signals DATA.

The touch sensing circuit 600 receives touch sensing signals from touch sensing lines TSL1 to TSLn. In an exemplary embodiment of the inventive concept, the touch sensing circuit 600 is operated in response to a mode signal MD provided from the driving controller 200. For example, when the mode signal MD is at an active level (e.g., a high level), the touch sensing circuit 600 determines whether a touch input occurs based on the touch sensing signals provided from the touch sensing lines TSL1 to TSLn and outputs a touch detection signal T_DET to the driving controller 200.

The display panel DP includes the scan lines SL1 to SLn, the data lines DL1 to DLm, and the pixels PX. The scan lines SL1 to SLn extend in a first direction DR1 and are arranged in a second direction DR2 to be spaced apart from each other. The data lines DL1 to DLm extend in the second direction DR2 and are arranged in the first direction DR1 to be spaced apart from each other. A third direction DR3 may be substantially perpendicular to the first and second directions DR1 and DR2.

Each of the light emitting control lines EL1 to ELn is substantially parallel to a corresponding scan line among the scan lines SL1 to SLn.

Each of the touch sensing lines TSL1 to TSLn is substantially parallel to a corresponding scan line among the scan lines SL1 to SLn. In an exemplary embodiment of the inventive concept, the touch sensing lines TSL1 to TSLn respectively correspond to the scan lines SL1 to SLn, however, the number of the touch sensing lines may be smaller than that of the scan lines SL1 to SLn. For example, the touch sensing lines may be arranged only in a predetermined area required to sense the touch input.

Each of the pixels PX is connected to a corresponding scan line among the scan lines SL1 to SLn, a corresponding light emitting control line among the light emitting control lines EL1 to ELn, a corresponding data line among the data lines DL1 to DLm, and a corresponding touch sensing line among the touch sensing lines TSL1 to TSLn.

Each of the pixels PX receives the first driving voltage ELVDD and the second driving voltage ELVSS having a voltage level lower than that of the first driving voltage ELVDD. Each of the pixels PX is connected to a first driving voltage line (e.g., power line, shown in FIG. 3) PL to which the first driving voltage ELVDD is applied. Each of the pixels PX is connected to an initialization line RL that receives the initialization voltage Vint.

Each of the pixels PX may be electrically connected to two scan lines. As shown in FIG. 5, pixels arranged in a second pixel row may be connected to the scan lines SL1 and SL2.

The scan lines SL1 to SLn, the light emitting control lines EL1 to ELn, the data lines DL1 to DLm, the first driving voltage line PL, the initialization line RL, the pixels PX, the scan driving circuit 300, and the data driving circuit 400 may be formed on a base substrate through a plurality of photolithography processes. Insulating layers may be formed on the base substrate through a plurality of depositing or coating processes. Each of the insulating layers may be a thin layer that entirely covers the display panel DP or may include at least one insulating pattern that overlaps a specific component of the display panel DP. The insulating layers may include an organic layer and/or an inorganic layer. In addition, an encapsulation layer may be further formed on the base substrate to protect the pixels PX.

The display panel DP receives the first driving voltage ELVDD and the second driving voltage ELVSS. The first driving voltage ELVDD is applied to the pixels PX via the first driving voltage line PL. The second driving voltage ELVSS is applied to the pixels PX via electrodes or power lines formed on the display panel DP.

The display panel DP receives the initialization voltage Vint. The initialization voltage Vint is applied to the pixels PX via the initialization line RL.

Figure 6:
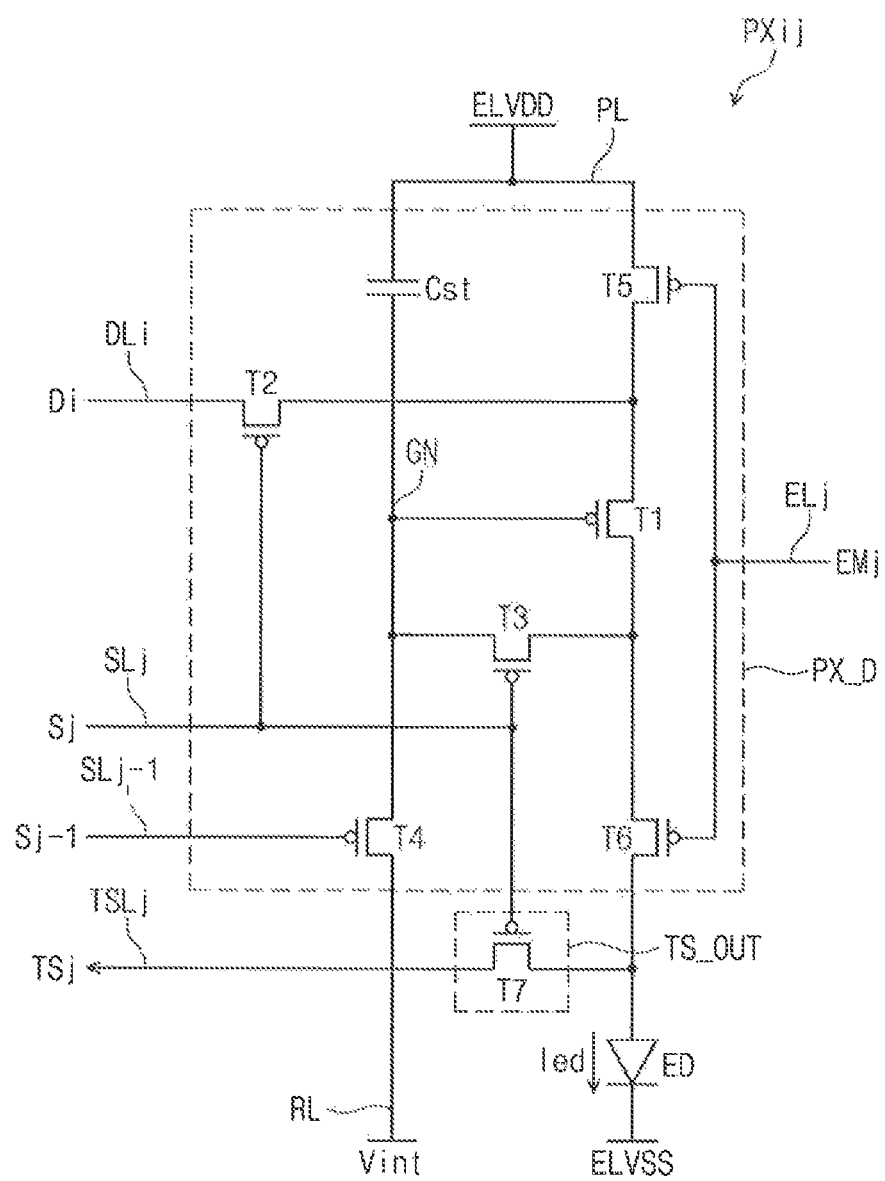
FIG. 6 is a circuit diagram showing a pixel according to an exemplary embodiment of the present inventive concept.

FIG. 6 is an equivalent circuit diagram showing a pixel PXij according to an exemplary embodiment of the present inventive concept.

FIG. 6 shows a representative example of the equivalent circuit diagram of the pixel PXij connected to an i-th data line DLi among the data lines DL1 to DLm, j-th and (j−1)th scan lines SLj and SLj−1 among the scan lines SL1 to SLn, and a j-th light emitting control line ELj among the light emitting control lines EL1 to ELn. Each of the pixels PX shown in FIG. 5 may have the same circuit configuration as the equivalent circuit diagram of the pixel PXij shown in FIG. 6.

Referring to FIG. 6, the pixel PXij includes an organic light emitting diode ED (hereinafter, referred to as a "light emitting diode"), a pixel driving circuit PX_D for controlling a light emission of the light emitting diode ED, and a touch sensing output circuit TS_OUT. In the present exemplary embodiment, the pixel driving circuit PX_D of the pixel PXij includes first, second, third, fourth, fifth, and sixth transistors T1, T2, T3, T4, T5, and T6 and a capacitor Cst. The touch sensing output circuit TS_OUT includes a seventh transistor T7. In an exemplary embodiment of the inventive concept, each of the first to seventh transistors T1 to T7 may be a p-type transistor including an LTPS semiconductor layer, however, the inventive concept should not be limited thereto. In other words, according to another exemplary embodiment of the inventive concept, each of the first to seventh transistors T1 to T7 may be an n-type transistor including an oxide semiconductor as its semiconductor layer. In addition, according to another exemplary embodiment of the inventive concept, at least one transistor of the first to seventh transistors T1 to T7 may be the n-type transistor, and the other transistors of the first to seventh transistors T1 to T7 may be the p-type transistor. Further, the circuit configuration of the pixel driving circuit PX_D should not be limited to that shown in FIG. 6. For example, the pixel driving circuit PX_D shown in FIG. 6 is merely exemplary, and the configuration of the circuit may be changed.

The pixel driving circuit PX_D may include the transistors T1 to T6 and the capacitor Cst. At least one of the scan driving circuit 300 and the data driving circuit 400 shown in FIG. 5 may include transistors formed through the same process as the pixel driving circuit PX_D.

For convenience of explanation, the j-th scan line SLj and the (j−1)th scan line SLj−1 are referred to as a first scan line SLj and a second scan line SLj−1, respectively. The first scan line SLj and the second scan line SLj−1 may respectively transmit a first scan signal Sj and a second scan signal Sj−1. The first scan signal Sj and the second scan signal Sj−1 may turn on/turn off the second, third, fourth, and seventh transistors T2, T3, T4, and T7 that are the p-type transistor. The first scan signal Sj and the second scan signal Sj−1 may be signals having the same pulse width and period. The second scan signal Sj−1 is a signal whose phase is faster than that of the first scan signal Sj.

The light emitting control line ELj may transmit a light emitting control signal EMj to control the light emission of the light emitting diode ED included in the pixel PXij. The light emitting control signal EMj transmitted by the light emitting control line ELj may have a waveform different from the first scan signal Sj and the second scan signal Sj−1 transmitted by the first scan line SLj and the second scan line SLj−1. The data line DLi may transmit a data signal Di, and the first driving voltage line PL may transmit the first driving voltage ELVDD. The data signal Di may have a voltage level that varies depending on an image signal input to the display device, and the first driving voltage ELVDD may have a substantially constant level.

The first transistor T1 includes a first electrode connected to the first driving voltage line PL via the fifth transistor T5, a second electrode electrically connected to an anode of the light emitting diode ED via the sixth transistor T6, and a gate electrode connected to a first end of the capacitor Cst. The gate electrode of the first transistor T1 is connected to a node GN. The first transistor T1 receives the data signal Di transmitted over the data line DLi in response to a switching operation of the second transistor T2 and provides a driving current fed to the light emitting diode ED.

The second transistor T2 includes a first electrode connected to the data line DLi, a second electrode connected to the first electrode of the first transistor T1, and a gate electrode connected to the first scan line SLj. The second transistor T2 is turned on in response to the first scan signal Sj applied thereto via the first scan line SLj to transmit the data signal Di applied thereto from the data line DLi to the first electrode of the first transistor T1.

The third transistor T3 includes a first electrode connected to the gate electrode of the first transistor T1, a second electrode connected to the second electrode of the first transistor T1, and a gate electrode connected to the first scan line SLj. The first electrode of the third transistor T3 is connected to the node UN. The third transistor T3 is turned on in response to the first scan signal Sj applied thereto via the first scan line SLj−1 to connect the gate electrode and the second electrode of the first transistor T1, and thus, the first transistor is connected in a diode configuration.

The fourth transistor T4 includes a first electrode connected to the gate electrode of the first transistor T1, a second electrode connected to the initialization line RL transmitting the initialization voltage Vint, and a gate electrode connected to the second scan line SLj−1. The first electrode of the fourth transistor T4 is connected to the node GN. The fourth transistor T4 is turned on in response to the second scan signal Sj−1 applied thereto via the second scan SLj−1 to transmit the initialization voltage Vint to the gate electrode of the first transistor T1, and thus, an initialization operation is performed to initialize a voltage of the gate electrode of the first transistor T1.

The fifth transistor T5 includes a first electrode connected to the first driving voltage line PL, a second electrode connected to the first electrode of the first transistor T1, and a gate electrode connected to the j-th light emitting control line ELj.

The sixth transistor T6 includes a first electrode connected to the second electrode of the first transistor T1, a second electrode connected to the anode of the light emitting diode ED, and a gate electrode connected to the j-th light emitting control line ELj.

The fifth transistor T5 and the sixth transistor T6 are substantially simultaneously turned on by the light emitting control signal EMj applied thereto via the j-th light emitting control line ELj, and thus, the first driving voltage ELVDD is transmitted to the light emitting diode ED after being compensated by the first transistor T1 that is connected in the diode configuration.

As described above, the first end of the capacitor Cst is connected to the gate electrode of the first transistor T1, and a second end of the capacitor Cst is connected to the first driving voltage line PL.

A cathode of the light emitting diode ED may be connected to a terminal that transmits the second driving voltage ELVSS.

The touch sensing output circuit TS_OUT outputs a voltage of the anode of the light emitting diode ED to a j-th touch sensing line TSLj in response to the first scan signal Sj applied thereto via the first scan line SLj.

The seventh transistor T7 of the touch sensing output circuit TS_OUT includes a first electrode connected to the anode of the light emitting diode ED, a second electrode connected to the j-th touch sensing line TSLj, and a gate electrode connected to the first scan line SLj. In addition, the gate electrode of the seventh transistor T7 is connected to the gate electrode of the third transistor T3, and the first electrode of the seventh transistor T7 is connected to the second electrode of the sixth transistor T6. In response to the first scan signal Sj, the seventh transistor T7 is turned on such that a voltage at the anode of the light emitting diode ED can be transferred to the j-th touch sensing line TSLj.

The operation of the display device according to an exemplary embodiment of the present inventive concept will be described with reference to FIGS. 6 and 7.

Figure 7:
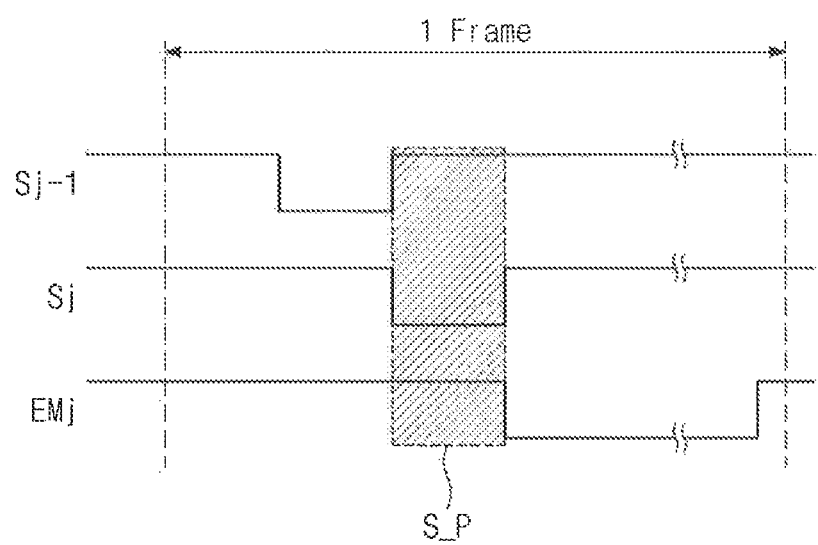
FIG. 7 is a timing diagram showing an operation of a display device according to an exemplary embodiment of the present inventive concept.

FIG. 7 is a timing diagram showing the operation of the display device according to an exemplary embodiment of the present inventive concept.

Referring to FIGS. 6 and 7, the second scan signal Sj−1 at a low level is provided via the second scan line SLj−1 during an initialization period of one frame. The fourth transistor T4 is turned on in response to the second scan signal Sj−1 at the low level, and the initialization voltage Vint is transmitted to the gate electrode of the first transistor T1 through the fourth transistor T4, thereby initializing the first transistor T1.

Then, when the first scan signal Sj at the low level is provided via the first scan line SLj during a data programming and compensating period, the second transistor T2 is turned on, and substantially simultaneously, the third transistor T3 is turned on. In this case, the first transistor T1 is connected in a diode configuration by the turned-on third transistor T3 and is forward-biased. Then, a compensation voltage Di-Vth, which is a threshold voltage pith of the first transistor T1 subtracted from the data signal Di provided from the data line DLi, is applied to the gate electrode of the first transistor T1. In other words, the gate voltage applied to the gate electrode of the first transistor T1 may become the compensation voltage Di-Vth.

The first driving voltage ELVDD and the compensation voltage Di-Vth are applied to both ends of the capacitor Cst, and the capacitor Cst is charged with electric charges corresponding to a difference in voltage between the both ends of the capacitor Cst.

Then, the light emitting control signal EMj provided from the j-th light emitting control line ELj during a light emission period is changed to the low level from the high level. The fifth transistor T5 and the sixth transistor T6 are turned on in response to the light emitting control signal EMj at the low level during the light emission period. Accordingly, the driving current occurs due to the voltage difference between the gate voltage of the gate electrode of the first transistor T1 and the first driving voltage ELVDD, and the driving current is applied to the light emitting diode ED via the sixth transistor T6. As a result, the driving current Ied flows through the light emitting diode ED.

In addition, the seventh transistor T7 outputs the voltage of the anode of the light emitting diode ED to the j-th touch sensing line TSLj during a sensing period S_P in which the first scan signal Sj is at the low level; the second scan signal Sj−1 is at the high level, and the light emitting control signal EMj is at the high level.

Figure 8:
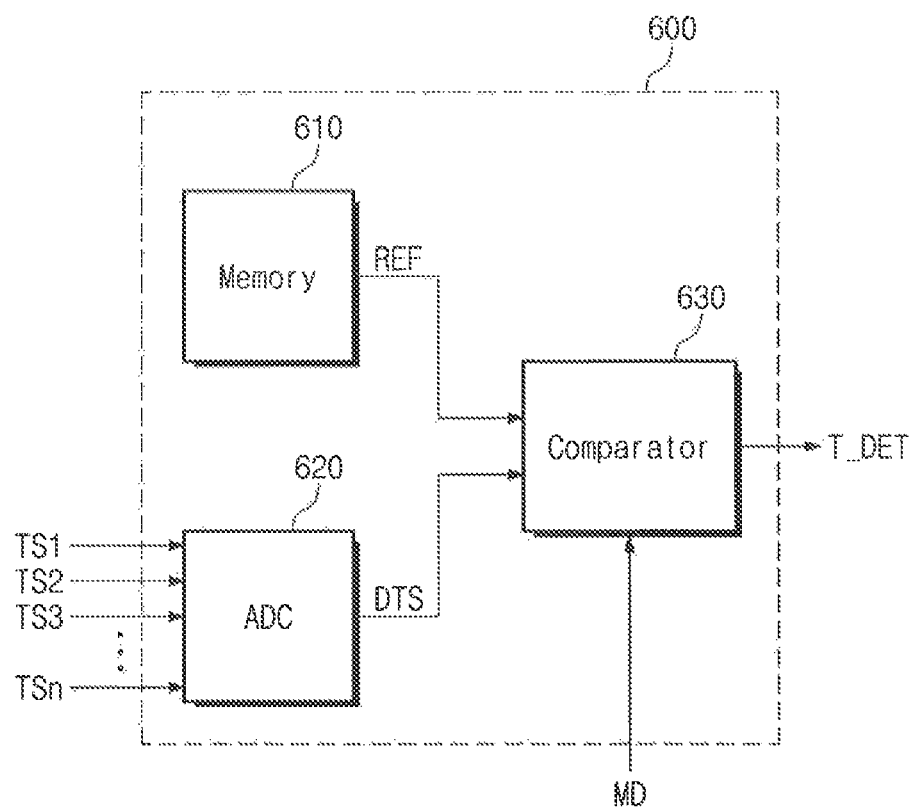
FIG. 8 is a block diagram showing a touch sensing circuit according to an exemplary embodiment of the present inventive concept.

FIG. 8 is a block diagram showing the touch sensing circuit 600 according to an exemplary embodiment of the present inventive concept.

Referring to FIG. 8, the touch sensing circuit 600 includes a memory 610, an analog-to-digital converter 620, and a comparator 630.

The memory 610 stores a reference value REF. The analog-to-digital converter 620 converts each of touch sensing signals TS1 to TSn applied thereto from the touch sensing lines TSL1 to TSLn to a digital sensing signal DTS. The comparator 630 compares the reference value REF with the digital sensing signal DTS and outputs the touch detection signal T_DET corresponding to the compared result. In the present exemplary embodiment, the comparator 630 is operated in response to the mode signal MD. For example, when the mode signal MD is at an active level (e.g., the high level), the comparator 630 compares the reference value REF with the digital sensing signal DTS and outputs the touch detection signal T_DET corresponding to the compared result. When the mode signal MD is at a non-active level (e.g., the low level), the comparator 630 is not operated.

Referring to FIGS. 5, 6, and 8, the driving controller 200 may output the mode signal MD at the active level (e.g., the high level) in a specific operation mode. When the input sensing unit ISU (refer to FIG. 4) is in an inoperable mode in which a normal operation is not possible, the driving controller 200 outputs the mode signal MD at the active level. For example, the input sensing unit ISU operated in a capacitive manner may not sense the touch input by the user in an aqua mode in which the display device DD (refer to FIG. 1) is immersed in water. The driving controller 200 outputs the mode signal MD at the active level in the aqua mode. Therefore, the touch input by the user in the aqua mode may be sensed by the pixels PX and the touch sensing circuit 600 of the display panel PD rather than the input sensing unit ISU.

The driving controller 200 may output the mode signal MD at the non-active level (e.g., the low level) when it is not in the specific operation mode (for example, aqua mode). The touch sensing circuit 600 is not operated when the mode signal MD is at the non-active level. For example, the touch sensing circuit 600 is not operated in a normal mode in which the input sensing unit ISU is normally operated.

Figure 9:
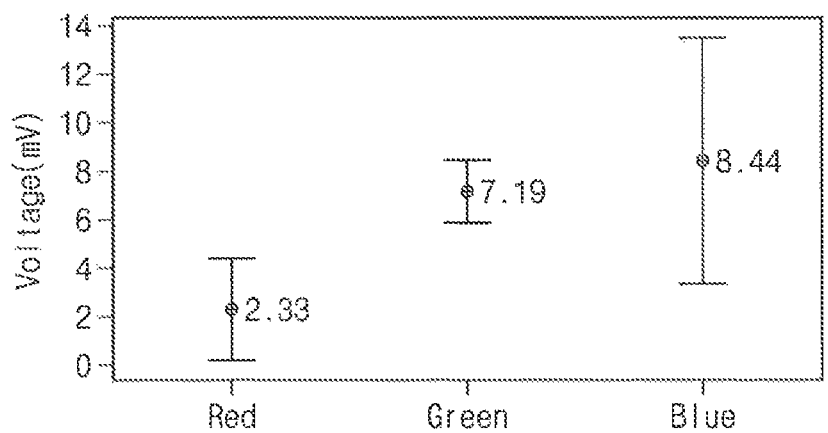
FIG. 9 is a view showing an operating characteristic of a light emitting diode according to an exemplary embodiment of the inventive concept.

FIG. 9 is a view showing an operating characteristic of the light emitting diode ED according to an exemplary embodiment of the inventive concept.

Referring to FIGS. 6 and 9, in a case where the light emitting diode ED absorbs an external light, an electron-hole pair is formed when electrons pop out and become free, in this case, an instantaneous voltage is generated due to a difference in mobility between electrons and holes, and the voltage of the anode of the light emitting diode ED is changed.

A light emission color, such as red, green, and blue colors, of the light emitting diode ED may be determined depending on the type of impurity added to the light emitting diode ED, and the voltage of the anode may be changed differently even though the same external light is irradiated. For example, the voltage of the anode of the light emitting diode ED of the red color increases from about 0 volts when the light is not irradiated to about an average of 2.33 volts after the light is irradiated. The voltage of the anode of the light emitting diode ED of the green color increases from about 0 volts when the light is not irradiated to about an average of 7.19 volts after the light is irradiated. The voltage of the anode of the light emitting diode ED of the blue color increases from about 0 volts when the light is not irradiated to about an average of 8.44 volts after the light is irradiated. As described above, the voltage variation of the anode differs depending on the color of the light emitting diode ED by the same external light, however, the voltage level of the anode increases regardless of the color of the light emitting diode ED as shown in FIG. 9.

Figure 10:
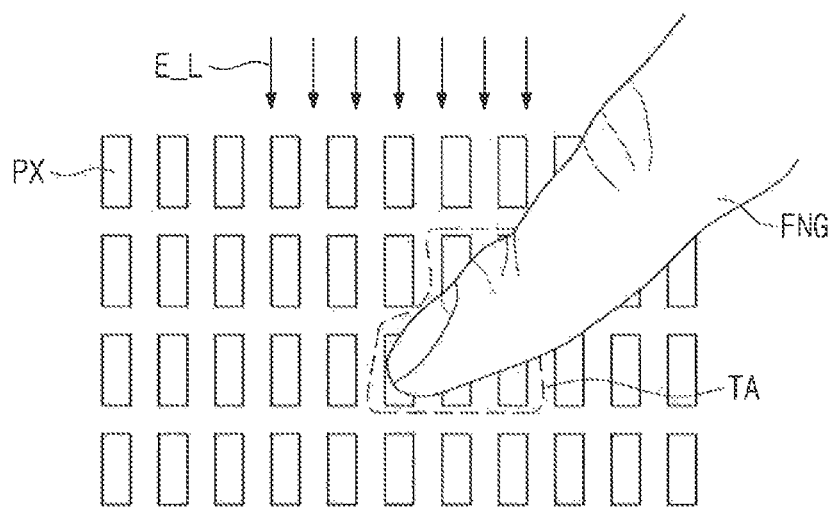
FIG. 10 is a view showing an operation of a display device according to an exemplary embodiment of the inventive concept according to an amount of variation in an external light.

FIG. 10 is a view showing an operation of the display device according to an exemplary embodiment of the inventive concept according to an amount of variation in an external light.

Referring to FIG. 10, it is assumed that the user touches a touch area TA of the display panel DP to execute a specific application (e.g., camera shutter) in the aqua mode in which the display device DD (refer to FIG. 1) is immersed in water. When the external input FNG makes contact with the touch area TA of the display panel DP, the external light is blocked in the touch area TA by the external input FNG. In the pixels PX disposed in the touch area TA, the voltage level of the anode of the light emitting diode ED increases when the external light E_L is input, and the voltage level of the anode of the light emitting diode ED decreases when the external light E_L is blocked. In an exemplary embodiment of the present inventive concept, the touch sensing circuit 600 may determine whether the touch input occurs by sensing the variation in the voltage level of the anode of the light emitting diode ED.

The comparator 630 shown in FIG. 8 outputs the touch detection signal T_DET at the active level (e.g., the high level) when the variation of the digital sensing signal DTS output from the analog-to-digital converter 620 is greater than the reference value REF. In addition, the comparator 630 outputs the touch detection signal T_DET at the non-active level (e.g., the low level) when the variation of the digital sensing signal DTS output from the analog-to-digital converter 620 is smaller than the reference value REF.

The variation of the digital sensing signal DTS may be a difference between a digital sensing signal DTSk−1 in a (k−1)th frame and a digital sensing signal DTSk in a k-th frame, e.g., (DTSk−1)-(DTSk). The reference value REF stored in the memory 610 shown in FIG. 8 may be set by an optimum value according to an experimental result of the variation of the digital sensing signal DTS when the external light E_L is incident into the pixels PX and when the external light E_L is blocked.

The driving controller 200 shown in FIG. 5 may determine that the external input FNG occurs when the touch detection signal T_DET is at the active level (e.g., the high level) and may perform an operation corresponding to the external input FNG. For example, in the case where the camera application is being operated in the aqua mode, it may be recognized that a camera shutter is input when the touch detection signal T_DET is at the active level. Accordingly, the display device DD may sense the touch input using the display panel DP instead of the input sensing unit ISU in the aqua mode.

Figure 11:
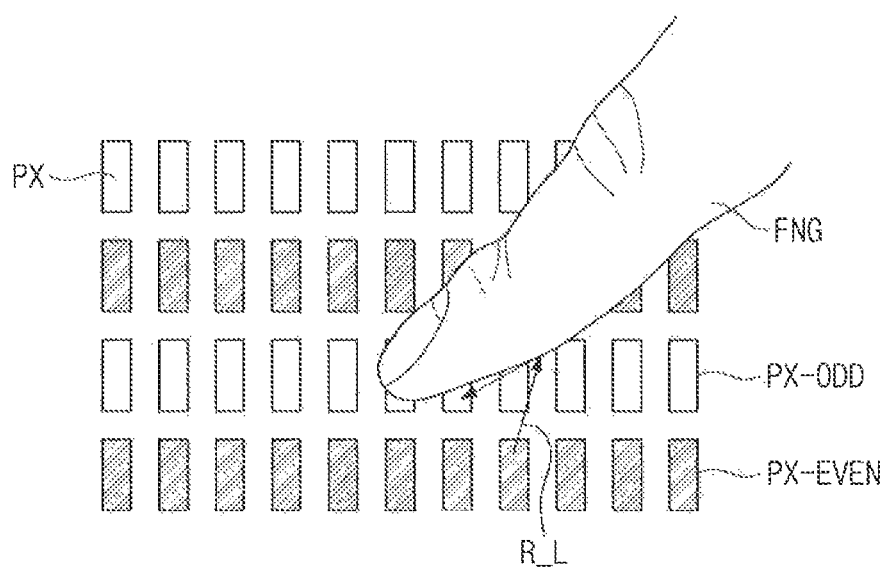
FIG. 11 is a view showing an operation of a display device according to an exemplary embodiment of the inventive concept according to an amount of variation in a reflected light.

FIG. 11 is a view showing an operation of a display device according to an exemplary embodiment of the inventive concept according to an amount of variation in a reflected light.

Referring to FIG. 11, it may not be easy to sense the amount of variation in external light in an environment where no external light is present or in an environment where the external light is low (e.g., at night). The display device DD may be operated to allow a group of pixels among the pixels PX to display an image with a predetermined grayscale in the environment where no external light is present or where the external light is low. For example, even-numbered pixels PX-EVEN emit the light while displaying the image with the predetermined grayscale in the aqua mode.

In the case where there is an external input FNG, the light output from the even-numbered pixels PX-EVEN may be supplied to odd-numbered pixels PX-ODD as a reflected light R_L as the external input FNG approaches the pixels PX. In addition, when the external input FNG makes contact with the pixels PX, the reflected light R_L is blocked.

The voltage level of the anode of the light emitting diode ED in the odd-numbered pixels PX-ODD may vary as the reflected light R_L is incident and blocked. Thus, the touch sensing circuit 600 may sense the variation in the voltage level of the anode of the light emitting diode ED in the environment where the external light is low.

FIG. 11 shows a method of sensing the touch input by sensing the variation in the voltage level of the anode of the light emitting diode ED in the odd-numbered pixels PX-ODD when the even-numbered pixels PX-EVEN emit the image with the predetermined grayscale in the aqua mode, however, the present inventive concept should not be limited thereto. For example, the odd-numbered pixels PX-ODD may emit the image with the predetermined grayscale in the aqua mode, and the touch input may be sensed by sensing the variation in the voltage level of the anode of the light emitting diode ED in the even-numbered pixels PX-EVEN. According to another exemplary embodiment of the inventive concept, the even-numbered pixels PX-EVEN and the odd-numbered pixels PX-ODD may alternately emit light every frame.

According to the above described embodiments of the inventive concept, the display panel may output the voltage of the anode of the light emitting diode to the touch sensing line. The touch sensing circuit of the display device may sense the variation in the voltage level of the anode of the light emitting diode to determine whether the touch input occurs. Therefore, even though the input sensing unit is in the inoperable mode in which the normal operation is not possible, it is possible to determine whether the touch input occurs based on the variation in the voltage level of the anode of the light emitting diode.

While the inventive concept has been described with reference to exemplary embodiments thereof, it is understood that various changes and modifications can be made thereto by one of ordinary skill in the art without departing from the spirit and scope of the present inventive concept as set forth in the attached claims.

What is claimed is:

1. A display panel, comprising:
   a plurality of data lines;
   a plurality of scan lines;
   a plurality of light emitting control lines;
   a plurality of touch sensing lines; and
   a plurality of pixels connected to the data lines, the scan lines, the light emitting control lines, and the touch sensing lines, a first pixel among the pixels comprising:
   a light emitting diode comprising an anode and a cathode;
   a pixel driving circuit configured to apply a current corresponding to a data signal received through a first data line among the data lines to the anode in response to a first scan signal received through a first scan line among the scan lines and a light emitting control signal received through a first light emitting control line among the light emitting control lines; and a touch sensing output circuit configured to apply a voltage of the anode to a first touch sensing line among the touch sensing lines in response to the first scan signal, wherein the touch sensing output circuit comprises a transistor comprising a first electrode connected to the anode, a second electrode directly connected to the first touch sensing line, and a gate electrode connected to the first scan line.

2. The display panel of claim 1, wherein the voltage of the anode corresponds to a difference in voltage between the anode and the cathode of the light emitting diode.

3. The display panel of claim 1, wherein the pixel driving circuit comprises:

a first transistor comprising a first electrode, a second electrode, and a gate electrode, wherein the gate electrode is connected to a first node;

a second transistor comprising a first electrode connected to the first data line, a second electrode connected to the first electrode of the first transistor, and a gate electrode connected to the first scan line;

a third transistor comprising a first electrode connected to the second electrode of the first transistor, a second electrode connected to the gate electrode of the first transistor, and a gate electrode connected to the first scan line;

a fourth transistor comprising a first electrode connected to the gate electrode of the first transistor, a second electrode for receiving an initialization voltage, and a gate electrode connected to a second scan line among the scan lines;

a fifth transistor comprising a first electrode for receiving a first driving voltage, a second electrode connected to the first electrode of the first transistor, and a gate electrode connected to the first light emitting control line; and a sixth transistor comprising a first electrode connected to the second electrode of the first transistor, a second electrode connected to the anode of the light emitting diode, and a gate electrode connected to the first light emitting control line.

4. The display panel of claim 3, wherein a second scan signal provided through the second scan line has a phase faster than a phase of the first scan signal.

5. The display panel of claim 3, wherein the cathode of the light emitting diode receives a second driving voltage, and the second driving voltage has a voltage level lower than the first driving voltage.

6. The display panel of claim 1, wherein the light emitting control signal has a non-active level when the first scan signal has an active level.

7. A display device, comprising:

a display panel comprising a plurality of data lines, a plurality of scan lines, a plurality of light emitting control lines, a plurality of touch sensing lines, and a plurality of pixels connected to the data lines, the scan lines, the light emitting control lines, and the touch sensing lines;

an input sensing unit disposed on the display panel and comprising a plurality of sensing electrodes to sense an external touch input;

a driving controller configured to receive an image signal and output an image data signal, a data control signal, and a scan control signal;

a data driving circuit configured to drive the data lines in response to the image data signal and the data control signal;

a scan driving circuit configured to drive the scan lines in response to the scan control signal; and a touch sensing circuit configured to output a touch detection signal in response to touch sensing signals applied to the touch sensing circuit from the touch sensing lines, a first pixel of the pixels comprising:

a light emitting diode comprising an anode and a cathode;

a pixel driving circuit configured to apply a current corresponding to a data signal received through a first data line among the data lines to the anode in response to a first scan signal received through a first scan line among the scan lines and a light emitting control signal received through a first light emitting control line among the light emitting control lines; and a touch sensing output circuit configured to apply a voltage of the anode to a first touch sensing line among the touch sensing lines in response to the first scan signal, wherein the driving controller applies a mode signal to the touch sensing circuit, and the touch sensing circuit applies the touch detection signal to the driving controller when the mode signal is at an active level.

8. The display device of claim 7, wherein the touch sensing circuit comprises:

a memory for storing a reference value;

an analog-to-digital converter configured to convert each of the touch sensing signals applied to the analog-to-digital converter from the touch sensing lines to a digital sensing signal; and a comparator configured to compare the reference value with the digital sensing signal and output the touch detection signal corresponding to a result of the comparison.

9. The display device of claim 8, wherein the touch detection signal is output at the active level when the digital sensing signal is greater than the reference value.

10. The display device of claim 8, wherein the comparator compares the reference value with the digital sensing signal and outputs the touch detection signal corresponding to the result of the comparison when the mode signal is at the active level.

11. The display device of claim 7, wherein the driving controller controls the data driving circuit and the scan driving circuit such that a group of pixels among the pixels displays an image having a predetermined gray scale when an amount of an external light is smaller than a reference level.

12. The display device of claim 7, wherein the voltage of the anode corresponds to a difference in voltage between the anode and the cathode of the light emitting diode depending on an amount of a light incident from an outside.

13. The display device of claim 7, wherein the touch sensing output circuit comprises a transistor comprising a first electrode connected to the anode, a second electrode connected to the first touch sensing line, and a gate electrode connected to the first scan line.

14. The display panel of claim 7, wherein the pixel driving circuit comprises:

a first transistor comprising a first electrode, a second electrode, and a gate electrode, wherein the gate electrode is connected to a first node;

a second transistor comprising a first electrode connected to the first data line, a second electrode connected to the first electrode of the first transistor, and a gate electrode connected to the first scan line;

a third transistor comprising a first electrode connected to the second electrode of the first transistor, a second electrode connected to the gate electrode of the first transistor, and a gate electrode connected to the first scan line;

a fourth transistor comprising a first electrode connected to the gate electrode of the first transistor, a second electrode for receiving an initialization voltage, and a gate electrode connected to a second scan line among the scan lines;

a fifth transistor comprising a first electrode for receiving a first driving voltage, a second electrode connected to the first electrode of the first transistor, and a gate electrode connected to the first light emitting control line; and a sixth transistor comprising a first electrode connected to the second electrode of the first transistor, a second electrode connected to the anode of the fight emitting diode, and a gate electrode connected to the first light emitting control line.

15. The display device of claim 14, wherein a second scan signal provided through the second scan line has a phase faster than a phase of the first scan signal.

16. The display device of claim 14, wherein the cathode of the light emitting diode receives a second driving voltage, and the second driving voltage has a voltage level lower than the first driving voltage.

17. The display device of claim 7, wherein the light emitting control signal is at a non-active level when the first scan signal is at an active level.

18. The display device of claim 7, wherein the driving controller outputs the mode signal at the active level when the input sensing unit is in an inoperable mode.

19. A display panel, comprising:
a plurality of pixels, wherein a first pixel of the plurality of pixels includes a pixel driving circuit and a touch sensing output circuit, the pixel driving circuit including:

a first transistor including a first electrode, a second electrode, and a gate electrode;

a second transistor including a first electrode connected to a data line, a second electrode connected to the first electrode of the first transistor, and a gate electrode connected to a first scan line;

a third transistor including a first electrode connected to the gate electrode of the first transistor, a second electrode connected to the second electrode of the first transistor, and a gate electrode connected to the first scan line;

a fourth transistor including a first electrode connected to the gate electrode of the first transistor, a second electrode for receiving an initialization voltage, and a gate electrode connected to a second scan line;

a fifth transistor including a first electrode for receiving a driving voltage, a second electrode connected to the first electrode of the first transistor, and a gate electrode connected to a light emitting control line; and a sixth transistor including a first electrode connected to the second electrode of the first transistor, a second electrode connected to an anode of a light emitting diode, and a gate electrode connected to the light emitting control line, the touch sensing output circuit including:

a seventh transistor including a first electrode connected to the anode, a second electrode directly connected to a touch sensing line, and a gate electrode connected to the first scan line.

20. The display panel of claim 19, wherein a voltage of the anode is applied to the touch sensing line in response to a first scan signal applied to the first scan line.

21. The display panel of claim 20, wherein the touch sensing output circuit senses a variation in a level of the voltage of the anode to determine whether a touch input occurs at the display panel.

* * * * *